(12) United States Patent
Lu et al.

(10) Patent No.: US 11,667,521 B2
(45) Date of Patent: Jun. 6, 2023

(54) METHOD OF CONSTRUCTING A MICROMECHANICAL DEVICE

(71) Applicant: City University of Hong Kong, Kowloon (HK)

(72) Inventors: Yang Lu, New Territories (HK); Libo Gao, Kowloon (HK); Sufeng Fan, Kowloon (HK); Yuejiao Wang, Kowloon (HK)

(73) Assignee: City University of Hong Kong, Kowloon (HK)

( * ) Notice: Subject to any disclaimer, the term of this patent is extended or adjusted under 35 U.S.C. 154(b) by 954 days.

(21) Appl. No.: 16/550,495

(22) Filed: Aug. 26, 2019

(65) Prior Publication Data

US 2021/0061646 A1 Mar. 4, 2021

(51) Int. Cl.
*B81B 7/02* (2006.01)
*B82B 3/00* (2006.01)
(Continued)

(52) U.S. Cl.
CPC .............. *B81B 7/02* (2013.01); *B29C 64/129* (2017.08); *B29C 64/393* (2017.08); *B33Y 10/00* (2014.12);
(Continued)

(58) Field of Classification Search
CPC ....... B81B 7/02; B29C 64/129; B29C 64/393; B33Y 10/00; B33Y 80/00; B82Y 35/00;
(Continued)

(56) References Cited

U.S. PATENT DOCUMENTS

| 5,545,367 A | 8/1996 | Bae et al. |
| 7,088,432 B2 | 8/2006 | Zhang |

(Continued)

FOREIGN PATENT DOCUMENTS

| CN | 107601425 A | * | 1/2018 | ............... B81C 1/00 |
| WO | WO-2016015996 A1 | * | 2/2016 | ........... B29C 64/135 |

OTHER PUBLICATIONS

Gao, L. et al, High-Entropy Alloy(HEA)-Coated Nanolattice structures and Their Mechanical Properties. Advanced Engineering Materials, 2017, 1700625.
Surjadi, J. U., et al, Mechanical Enhancement of Core-Shell Microlattices through High-Entropy Alloy Coating, Scientific Reports, 2018 8:5442.
(Continued)

*Primary Examiner* — Francis C Gray
(74) *Attorney, Agent, or Firm* — Renner Kenner Greive Bobak Taylor & Weber

(57) ABSTRACT

A method of constructing a micromechanical device by additive manufacturing for characterizing strength of a low dimensional material sample, the method including: a) deriving a three-dimensional representation arranged to represent a said micromechanical device with reference to at least one physical characteristic of a said low dimensional material sample; b) transforming the three-dimensional representation into a plurality of two-dimensional representations arranged to individually represent a portion of the three-dimensional representation; and c) forming the micromechanical device from a fluid medium arranged to transform its physical state by stereolithography apparatus in response to a manipulated illumination exposed thereto, whereby a said low dimensional material sample is loaded onto the formed micromechanical device.

20 Claims, 17 Drawing Sheets

(51) Int. Cl.
*B81C 1/00* (2006.01)
*B33Y 10/00* (2015.01)
*B33Y 80/00* (2015.01)
*B29C 64/393* (2017.01)
*B29C 64/129* (2017.01)
*B82Y 35/00* (2011.01)
*B82Y 40/00* (2011.01)
*B82Y 30/00* (2011.01)

(52) U.S. Cl.
CPC .......... *B33Y 80/00* (2014.12); *B81C 1/00373* (2013.01); *B82B 3/009* (2013.01); *B82Y 35/00* (2013.01); *B01L 2300/0809* (2013.01); *B81C 2201/0185* (2013.01); *B82Y 30/00* (2013.01); *B82Y 40/00* (2013.01)

(58) Field of Classification Search
CPC ................ B82Y 30/00; B81C 1/00373; B81C 2201/0185
See application file for complete search history.

(56) References Cited

U.S. PATENT DOCUMENTS

| | | | |
|---|---|---|---|
| 9,887,356 | B2 | 2/2018 | McAlpine et al. |
| 10,597,289 | B1* | 3/2020 | Woolley ............... B81C 99/0095 |
| 11,459,232 | B2* | 10/2022 | Davis .................... B29C 64/205 |
| 11,560,305 | B1* | 1/2023 | Nordin ................ B81C 1/00373 |
| 2005/0117866 | A1* | 6/2005 | Park ....................... B82Y 20/00 |
| | | | 385/129 |
| 2013/0273340 | A1* | 10/2013 | Neretina ........... H01L 29/66469 |
| | | | 427/259 |
| 2014/0315093 | A1 | 10/2014 | Greer |
| 2015/0137426 | A1 | 5/2015 | Van Esbroeck et al. |
| 2016/0016369 | A1 | 1/2016 | Tarbutton et al. |
| 2016/0167132 | A1 | 6/2016 | Panat |
| 2018/0088462 | A1 | 3/2018 | Vyatskikh et al. |
| 2020/0026066 | A1* | 1/2020 | Payne ................ G02B 26/0841 |

OTHER PUBLICATIONS

Zheng, X., et al, Ultralight, ultrastiff mechanical metamaterials, Science, 344, 1373 (2014).

* cited by examiner

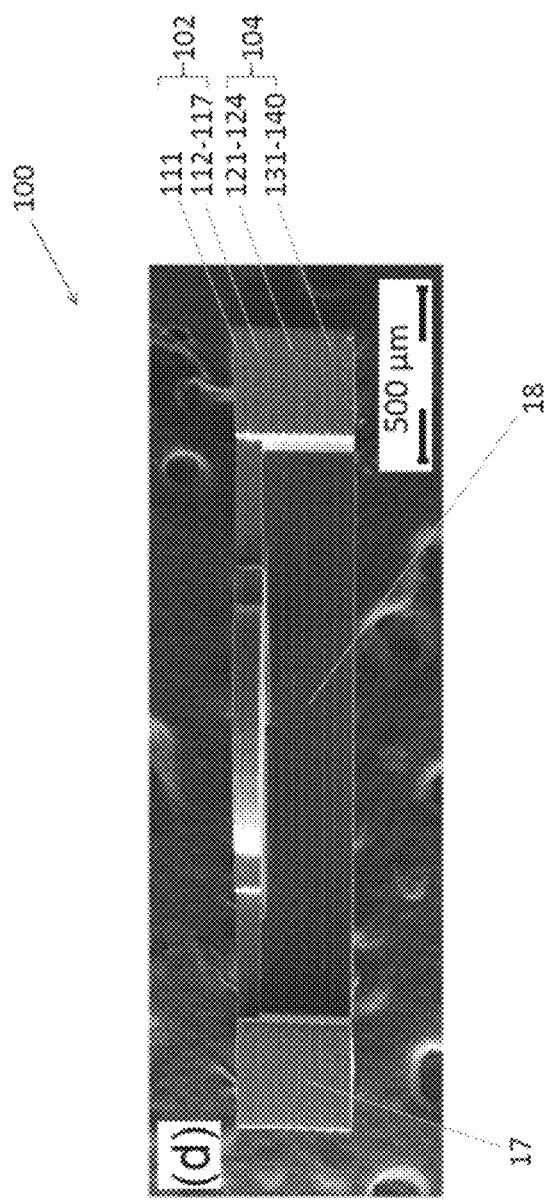

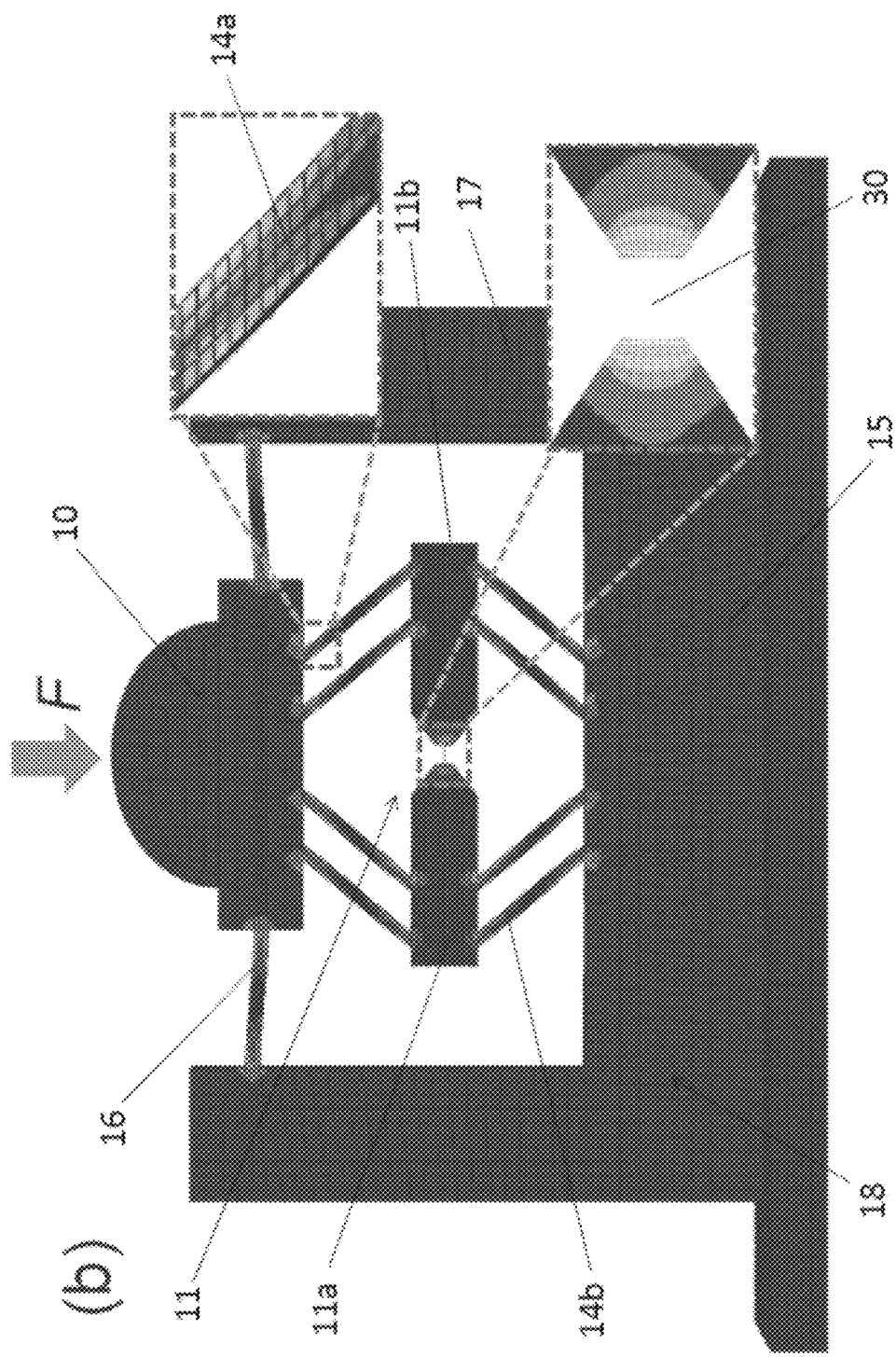

METHOD OF CONSTRUCTING A MICROMECHANICAL DEVICE

TECHNICAL FIELD

The present invention relates to a method of constructing a micromechanical device, and particularly, although not exclusively, to a method of constructing a micromechanical device for characterizing strength of a low dimensional micromaterial or nanomaterial sample.

BACKGROUND

One-dimensional (1D) micro/nanomaterials, such as micro/nanowires and nanotubes, sparked a wide range of investigations due to their unique physical properties and functional applications. Compared to their bulk counterparts, low dimensionality and high surface-to-volume ratios of them result in wide difference in optical, electrical, thermal, and mechanical behaviors. However, characterization of these properties at such small scales remains extremely challenging.

SUMMARY OF THE INVENTION

In accordance with a first aspect of the present invention, there is provided a method of constructing a micromechanical device for characterizing strength of a low dimensional material sample, the method comprising the steps of:

a) deriving a three-dimensional representation arranged to represent a said micromechanical device with reference to at least one physical characteristic of a said low dimensional material sample;

b) transforming the three-dimensional representation into a plurality of two-dimensional representations arranged to individually represent a portion of the three-dimensional representation; and c) forming the micromechanical device from a fluid medium arranged to transform its physical state in response to a manipulated illumination exposed thereto, whereby a said low dimensional material sample is loaded onto the formed micromechanical device.

In an embodiment of the first aspect, the method further includes step d) of characterizing strength of the low dimensional material sample with reference to strength of the first material.

In an embodiment of the first aspect, step a) further includes step a1) of:

generating a plurality of meshes each representing a portion of the three-dimensional representation; and analysing strength of one or more portions of the three-dimensional representation based on the generated meshes.

In an embodiment of the first aspect, step c) further includes step c1) of forming a portion of the micromechanical device from a first material with reference to a said two-dimensional representation.

In an embodiment of the first aspect, step c) further includes step c2) of forming another portion of the micromechanical device from the first material with reference to another said two-dimensional representation, with one formed portion of the micromechanical device stacked on the other formed portion of the micromechanical device.

In an embodiment of the first aspect, the two portions of the micromechanical device have a uniform thickness.

In an embodiment of the first aspect, the thickness of a portion of the micromechanical device is different from that of another portion of the micromechanical device.

In an embodiment of the first aspect, the method further includes step e) of solidifying the formed micromechanical device by exposing to an illumination.

In an embodiment of the first aspect, the illumination includes ultraviolet rays.

In an embodiment of the first aspect, the method further includes step f) of depositing a layer made of a second material onto the micromechanical device made of a first material for reinforcing the strength of the micromechanical device.

In an embodiment of the first aspect, the conductivity and toughness of the second material is higher than that of the first material.

In an embodiment of the first aspect, the first material includes polymer.

In an embodiment of the first aspect, the second material includes metal.

In an embodiment of the first aspect, step a) further includes step a2) of deriving an one-dimensional representation arranged to represent a gap between a pair of shuttles on the micromechanical device formed by step c) with reference to dimension of the said low dimensional material sample.

In an embodiment of the first aspect, the gap between the shuttles is at least 2 µm wide.

In an embodiment of the first aspect, the low dimensional material sample is one-dimensional or two-dimensional.

In an embodiment of the first aspect, the low dimensional material sample is selected from wire, tube, fibre and rod.

In an embodiment of the first aspect, the dimension of the low dimensional material sample is at microscale level or nanoscale level.

In an embodiment of the first aspect, the physical characteristic of the low dimensional material sample includes at least one of stiffness, length and thickness.

In an embodiment of the first aspect, the micromechanical device is a push to pull (PTP) device comprising a top shuttle onto which a compression force is exerted and a pair of shuttles through which the compression force exerted onto the top shuttle is converted to tensile force.

BRIEF DESCRIPTION OF THE DRAWINGS

Embodiments of the present invention will now be described, by way of example, with reference to the accompanying drawings in which:

FIG. 3d shows a SEM image of a 3D printed PTP device from the top view;

FIG. 5b is FEA modeling of a nanowire sample attached on a PTP device, with the insets showing close-up images of inclined beams meshes and sample shuttles meshes respectively;

DETAILED DESCRIPTION OF THE PREFERRED EMBODIMENT

Figure 1:
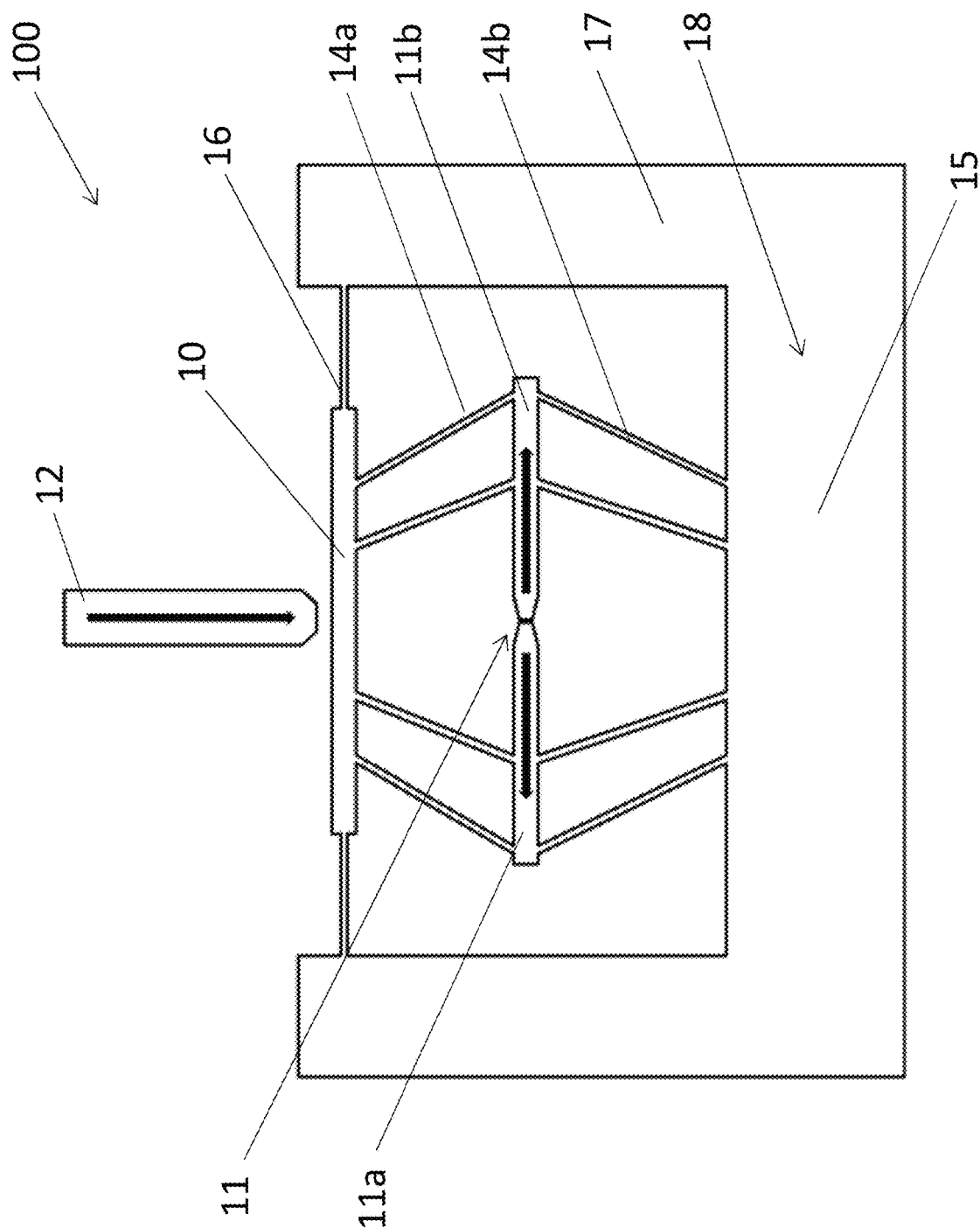
FIG. 1 is an illustration showing the working principle of a PTP device in accordance with one embodiment of the present invention.

Without wishing to be bound by theories, the inventors, through their own researches, trials and experiments, have devised that whilst micro-electromechanical system (MEMS)-type devices or Microfabricated mechanical devices (MMDs) may be used for characterizing the mechanical behaviour of 1D and 2D micro/nanomaterials under high resolution electron microscope or optical microscope, such devices are previously developed and manufactured based on "top-down" approach-based microfabrication e.g. silicon photolithography processes, which usually includes a series of deposition of material layers, patterning by photolithography, etching to remove sacrificial parts, and final device releasing, etc and therefore are extremely time consuming and costly.

Furthermore, the brittle nature of bulk silicon leads to relatively high failure rate of fabrication and vulnerability to damage of these devices. The manufacturing process is tedious and the precision of the process is low. All these factors greatly limit their wide applications in research and industry, as well as the further improvement of the device design. Therefore, developing an innovative and effective way to manufacture the micro-mechanical device is an urgent challenge and needed for the improvement of the nanomechanical testing.

The present invention provides a novel nanomechanical device which is fabricated by means of microscale additive manufacturing techniques including but not limited to stereolithography-based 3D printing such as Two Photon Lithography (TPL) and Projection Micro Lithographic Stereo Exposure (PμLSE). Effectively, the present invention can balance the cost and mechanical analysis in fabrication of the similar nanomechanical device based on polymer materials.

In contrast to those previous top-down fabrication approaches, the present invention provides a bottom-up approach based microfabrication. In this process, the materials are selectively added layer by layer to define fully 3D structure with significantly more freedom and tailorable intrinsic mechanics of the devices for various kind of nanomaterial specimen. It enables more flexible materials selectivity, complexity in geometrical design, and customizability, thus offering an effective and versatile route to fabricate dedicated MEMS.

Additionally, the present invention would greatly avoid the huge cost based on trial-and-error silicon wafer fabrication of nanomechanical devices, since 3D printing can be more versatile and adaptive for design and improving the micromechanical devices with tunable stiffness. The versatility of the high-resolution 3D printing allows the fabrication of a wide range of MMDs with various design and dimensions, facilitating the in-situ tensile testing of micro/nanowires with diameters ranging from nanometers to microns.

With reference to FIGS. 1 to 6d, there is provided an example embodiment of a method of constructing a micromechanical device 100 for characterizing strength of a low dimensional material sample 30, the method comprising the steps of: a) deriving a three-dimensional representation arranged to represent a said micromechanical device 100 with reference to at least one physical characteristic of a said low dimensional material sample 30; b) transforming the three-dimensional representation into a plurality of two-dimensional representations arranged to individually represent a portion of the three-dimensional representation; and c) forming the micromechanical device 100 from a fluid medium arranged to transform its physical state in response to a manipulated illumination exposed thereto, whereby a said low dimensional material sample 30 is loaded onto the formed micromechanical device 100.

Figure 5A:
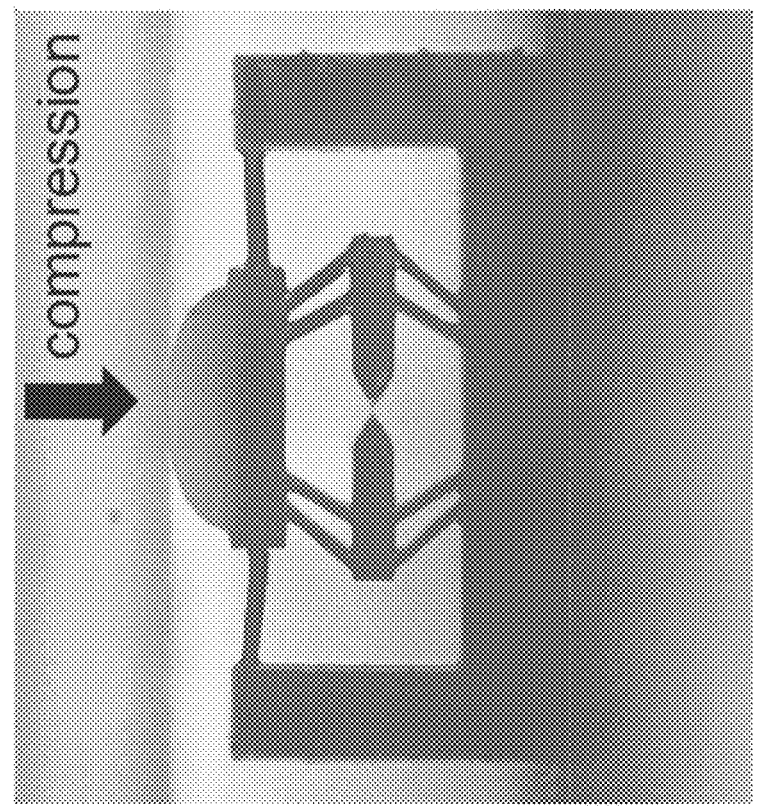
FIG. 5a is a mechanical testing setup showing a PTP device under the compression load from a microtest stage.
Figure 5A:
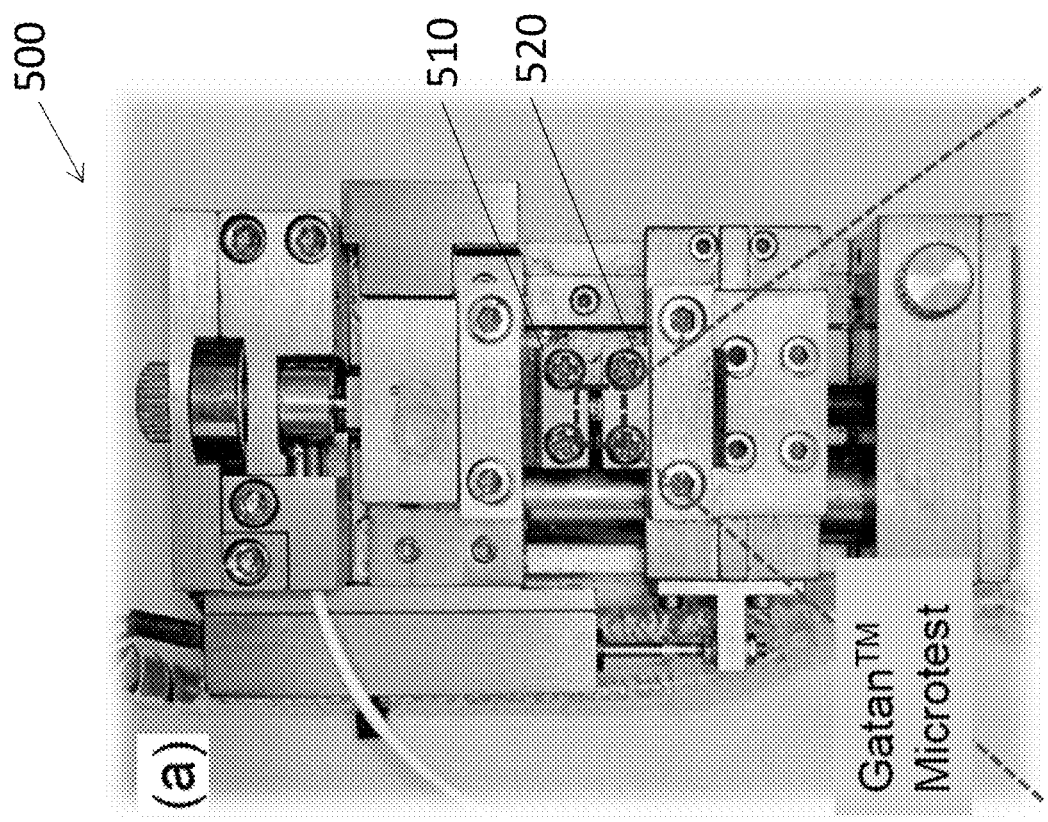

The micromechanical device (MMD) 100 is a preferably push to pull (PTP) device as depicted in FIG. 1 for testing under a micro-compression stage 500 as shown in FIG. 5a. The micro-compression stage 500 includes a flat upper compression head 510 and a lower compression head 520, together compressing the push to pull (PTP) micromechanical testing device (MMD) 100 in a vertical direction.

In one geometrical design, the core structure 102 of the micromechanical testing device 100 includes a top shuttle platform 10 for receiving a load from the flat upper compression head 510 (as shown in FIG. 5a) and a sample stage 11 for receiving a sample 30. The sample stage 11 includes a pair of symmetrically movable sample stage shuttles 11a, 11b, each of which are attached to the top shuttle platform 10 and the bottom 18 respectively. In a default configuration, the sample stage shuttles 11a, 11b are separated from each other by a gap 20 preferably at least 2 μm.

The micromechanical testing device 100 also includes an anchor pad 15 that comprises a bottom pad 18 and two columns 17 on the two sides. The bottom pad 18 is attached to the lower compression head 520 and serves as a supporting structure 104 for the core structure 102. In order to bear load from the large flat upper compression head 510, the top shuttle 10 of the micromechanical testing device 100 must be higher enough than columns 17 of the anchor pad 15 and thus preferably the top shuttle 10 is configured as a half-moon shape. The compressing force is applied on the top of the half-moon shape shuttle 10 along the vertical direction.

The micromechanical testing device 100 further includes one or more inclined parallel beams 14a for connecting the sample stage shuttles 11 to the top shuttle platform 10 and includes one or more inclined parallel beams 14b for connecting the sample stage shuttles 11 to the bottom 18 of the anchor pad 15. The overall stiffness of the device 10 is manipulated by the number of inclined beams 14a, 14b and the inclination angle of the inclined beams 14a, 14b with respect to the sample stage shuttles 11. In addition, the transfer of load and motion is also facilitated by inclined beams 14a, 14b.

The top shuttle platform 10 is also connected to the two columns 17 of the anchor pad 15 through a pair of lateral support beams 16. The two connecting horizontal beams 16 provide part of its resilient ability and keep the top shuttle 10 moving symmetrically along the vertical direction. The side columns 17 as well as the bottom 15 of the micromechanical testing device 100 acting as a support have a minimal impact on its mechanical behaviour and thus measurement performance.

A nanoindenter 12 is preferably placed above the top shuttle platform 10 and in movable contact with top shuttle platform 10. To load the micromechanical testing device 100, a sample material 30 is positioned on a gap 20 formed between the two shuttles 11a, 11b and the two ends of the sample 30 are connected between the two sample stage shuttles 11a, 11b.

Preferably, the nanoindenter 12 aligned in the center of top shuttle platform 10 results in the sample stage shuttles 11a, 11b moving symmetrically away from one another and ensures that the sample 30 clamped between the two sample stage shuttles 11a, 11b is exposed to a purely tensile force.

The micromechanical testing device 100 is combined with in-situ SEM technology. In this way, in-situ tensile tests can be done, and the deformation process of sample 30 can be observed clearly. Therefore, the fracture mechanism of different low dimensional material can be studied.

During the in-situ tensile test, the nanoindenter 12 pushes along a perpendicular axis of the micromechanical testing device 100 and applies a compression force to the top shuttle platform 10. The compression force generated by the nanoindenter 12 is transformed into two-dimensional linear motion of the sample stage shuttles 11a, 11b such that the sample stage shuttles 11a, 11b are moved apart from one another and increase the gap 20 across the two shuttles 11a, 11b. In turn, such linear motion applies a tensile force to sample 30 and the sample 30 will be stretched. The relative motion of the nanoindenter 12 and the sample stage shuttles 11a, 11b are represented by the block arrows in FIG. 1.

The testing sample 30 is a low dimensional object preferably a one-dimensional (1D) material such as wire, tube, fibre and rod or alternatively a two-dimensional (2D) material with unknown mechanical properties. The dimension of the testing sample 30 may also be increased to microscale level such as Lead Zirconate Titanate (PZT) microwire with a diameter of 2.5 μm or other nanomaterial. The testing sample 30 may further include other microscale materials such as biological fibrils, electrospun polymer fibers, microelectronic bonding wires. By loading the sample 30 onto the micromechanical testing device 100 and subjecting the sample 30 under tensile force, the material strength such as stiffness, strain, Young's Modulus, and Ultimate Tensile Strength (UTS) can be determined.

As the micromechanical testing device 100 is used for tensile testing of wide range of 1D micro/nanowires with different properties, the dimensions and intrinsic stiffness of the devices 100 should be adjustable such that the mechanical property of the micromechanical testing device 100 may be readily tuned with the flexibility of the choice of polymer and rational design of the topological structure. The stiffness of the micromechanical testing device 100 should also support the actuation and application of the device 100 at microscale level.

Preferably, the micromechanical testing device 100 should be able to withstand large elastic strain and preferably made of material with good stiffness and elasticity such as polymer mainly made up of acyclic acid. In addition, the material should also be photosensitive such as photopolymer and photoresist. For instance, the material would present as a fluid medium and capable of transforming into solid state upon subjecting to manipulated illumination. The printed MDD 100 may be further solidified under exposure.

Figure 2:
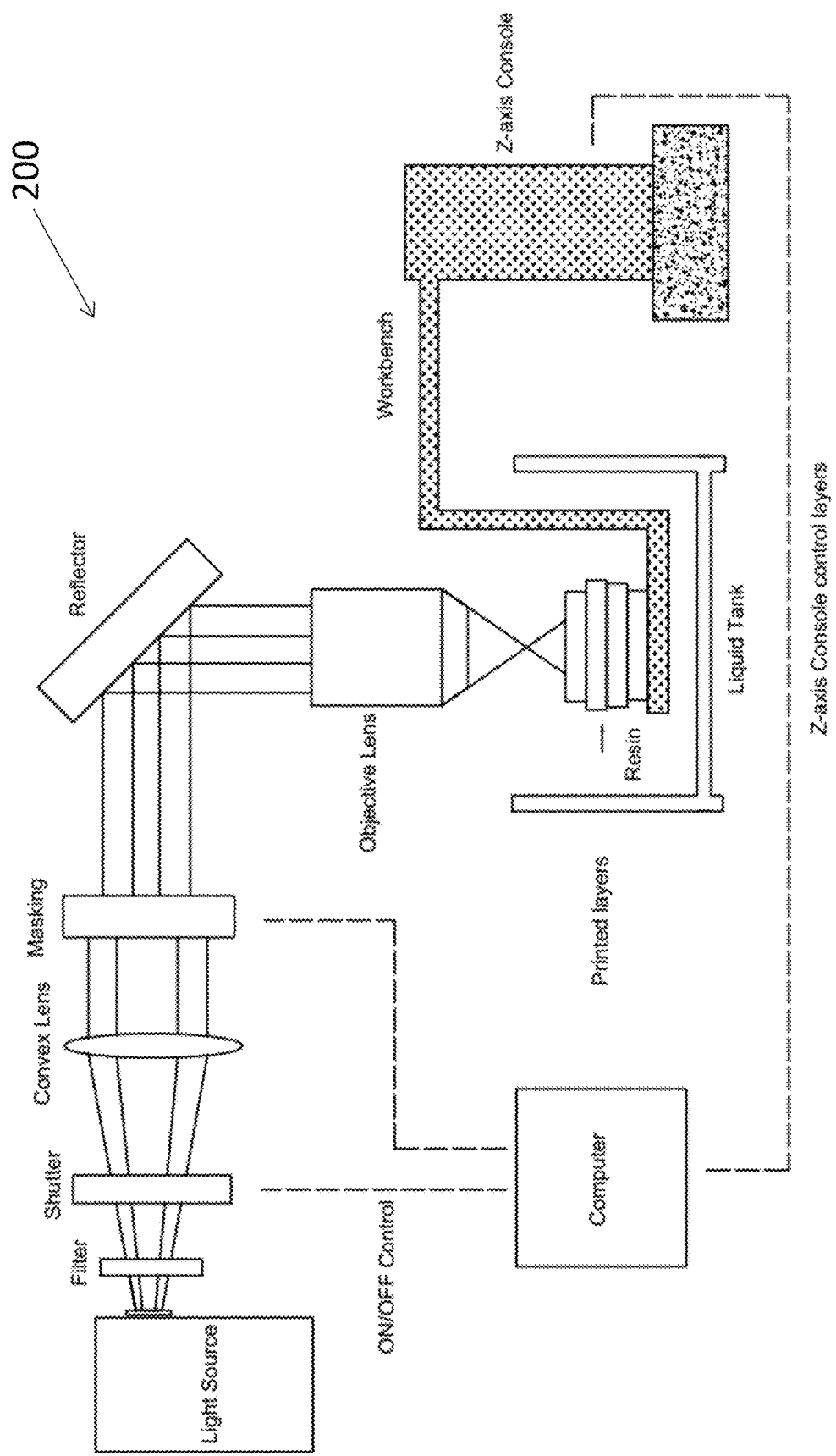
FIG. 2 displays a process of manufacturing PµLSE based PTP device.
Figure 3A:
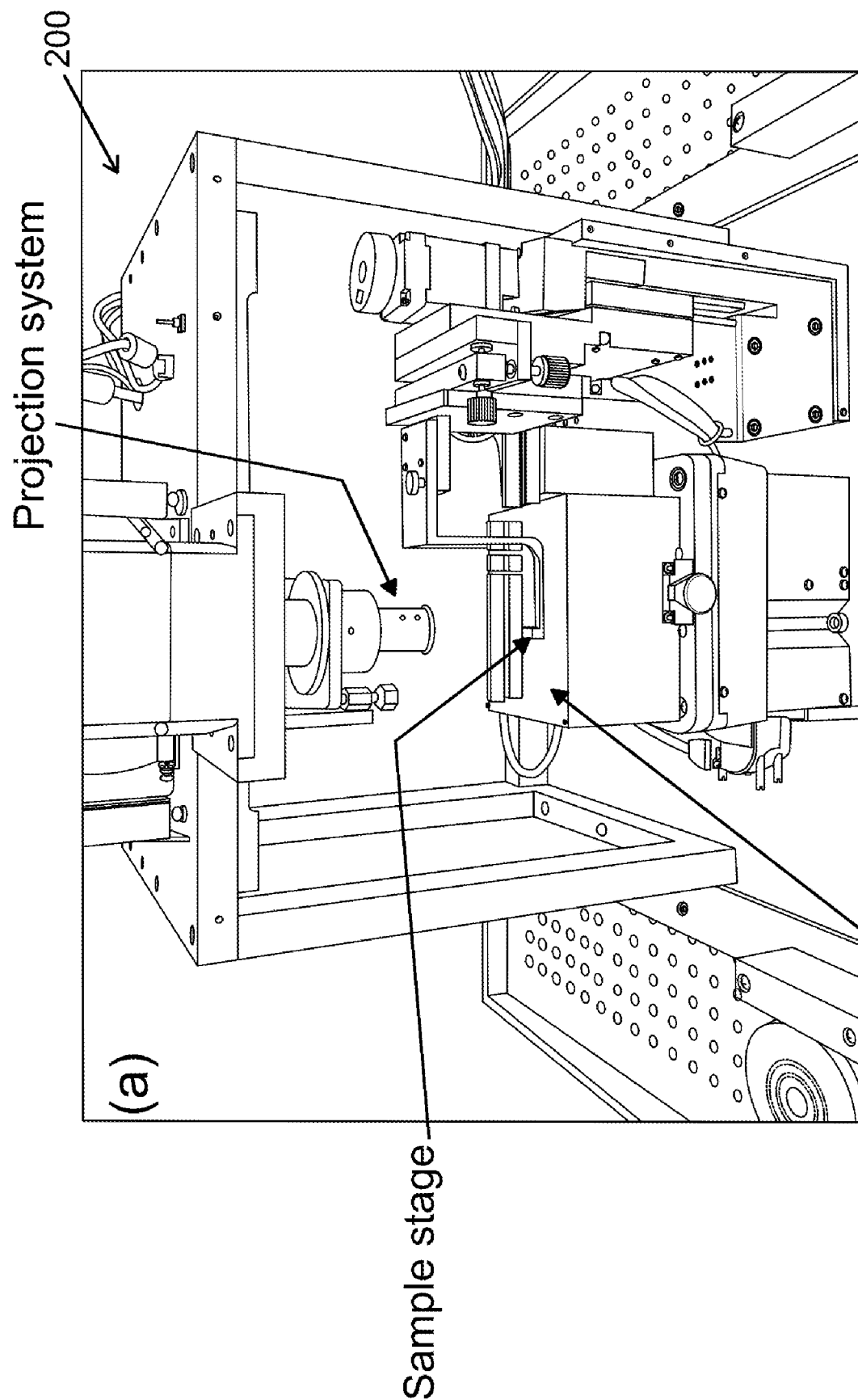
FIG. 3a shows a PµSL-based 3D printing system for fabrication of PTP devices.

In one example embodiment, a Projection Micro Lithographic Stereo Exposure (PμLSE) based push to pull (PTP) device 100 is printed out from a photosensitive polymer mainly made up of acyclic acid using a 3D printing device 200 e.g. a PμSL-based 3D printing system as shown in FIGS. 2 and 3a.

Initially, the structure of PTP device 100 is designed for accommodating different samples 30. A three-dimensional (3D) model representative of the PTP device 100 is built by modelling software such as Solidworks. The model is readily tuned based on custom requirements such as the length of the nanowires sample 30. For example, for short nanowires, the gap 20 should be narrow enough to accommodate the length of the sample 30. The model may also be tuned based on the physical characteristic of the sample e.g. stiffness and thickness etc.

Finite element method (FEM) is then adopted to optimize geometrical design of the device 100 to achieve the optimal testing performance and mechanical stability according the different samples. In particular, a 3D model of the PTP device 100 is meshed appropriately with proper parameters to form a plurality of grids each representing a portion of the model 100 including the inclined beams 14a, 14b and sample shuttles 11a, 11b at which the stress is concentrated. The overall strength and stiffness of the modelled PTP device 100 is then analysed based on the three-dimensional meshes.

After FEM and refinement of model, the refined model will be transferred to printing software for slicing. The 3D model is sliced into a number of slices each representing a portion of the PTP device 100 for additive manufacturing. Preferably, the core structure 102 of the model will be sliced into a large number of slices to retain the details of the core structure 102. The rest of the model with similar geometry will be sliced into a smaller number of slices. Accordingly, the efficiency of the printing process would not be compromised by the quality of product. Finally, the device 100 will be printed with PμLSE printer.

Figure 3B:
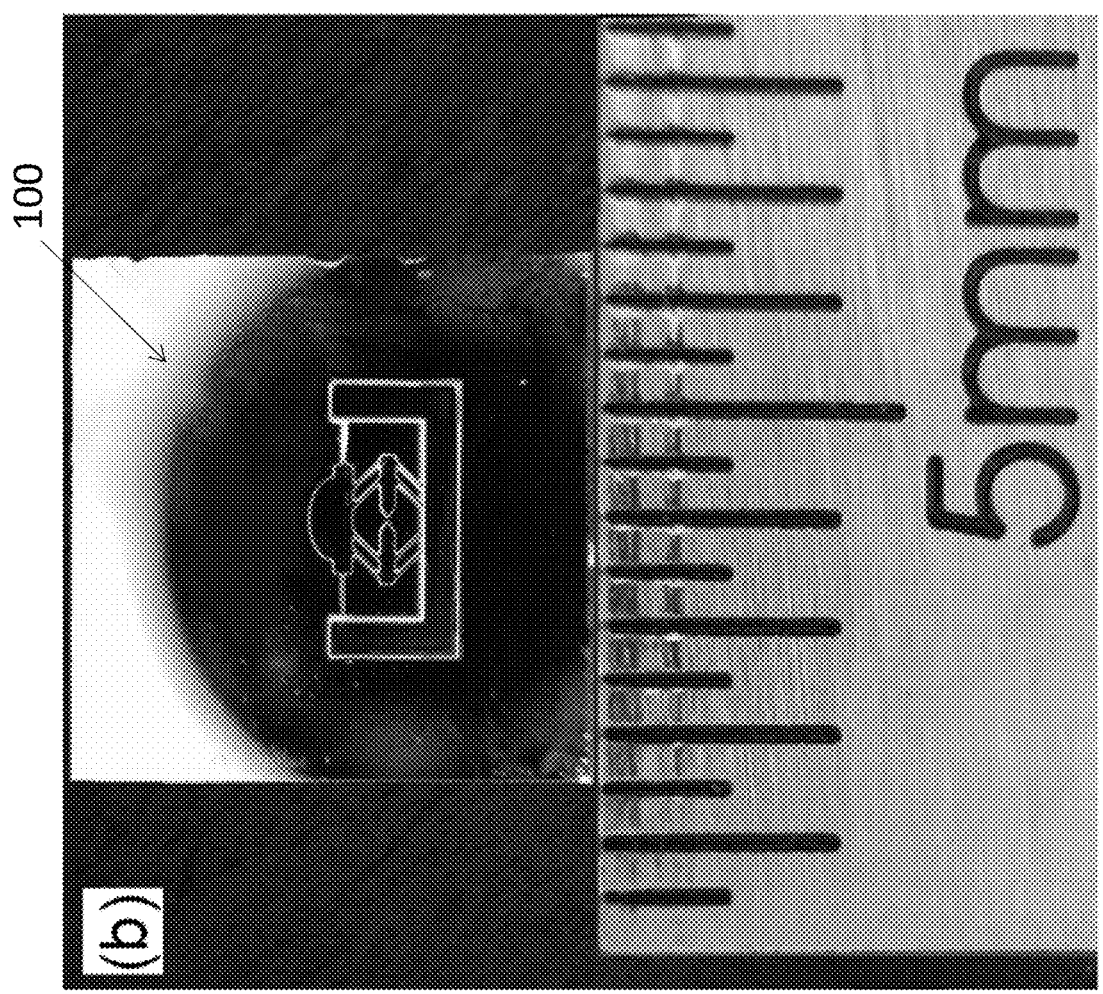
FIG. 3b shows an optical image of the printed PTP device on silicon wafer.
Figure 3C:
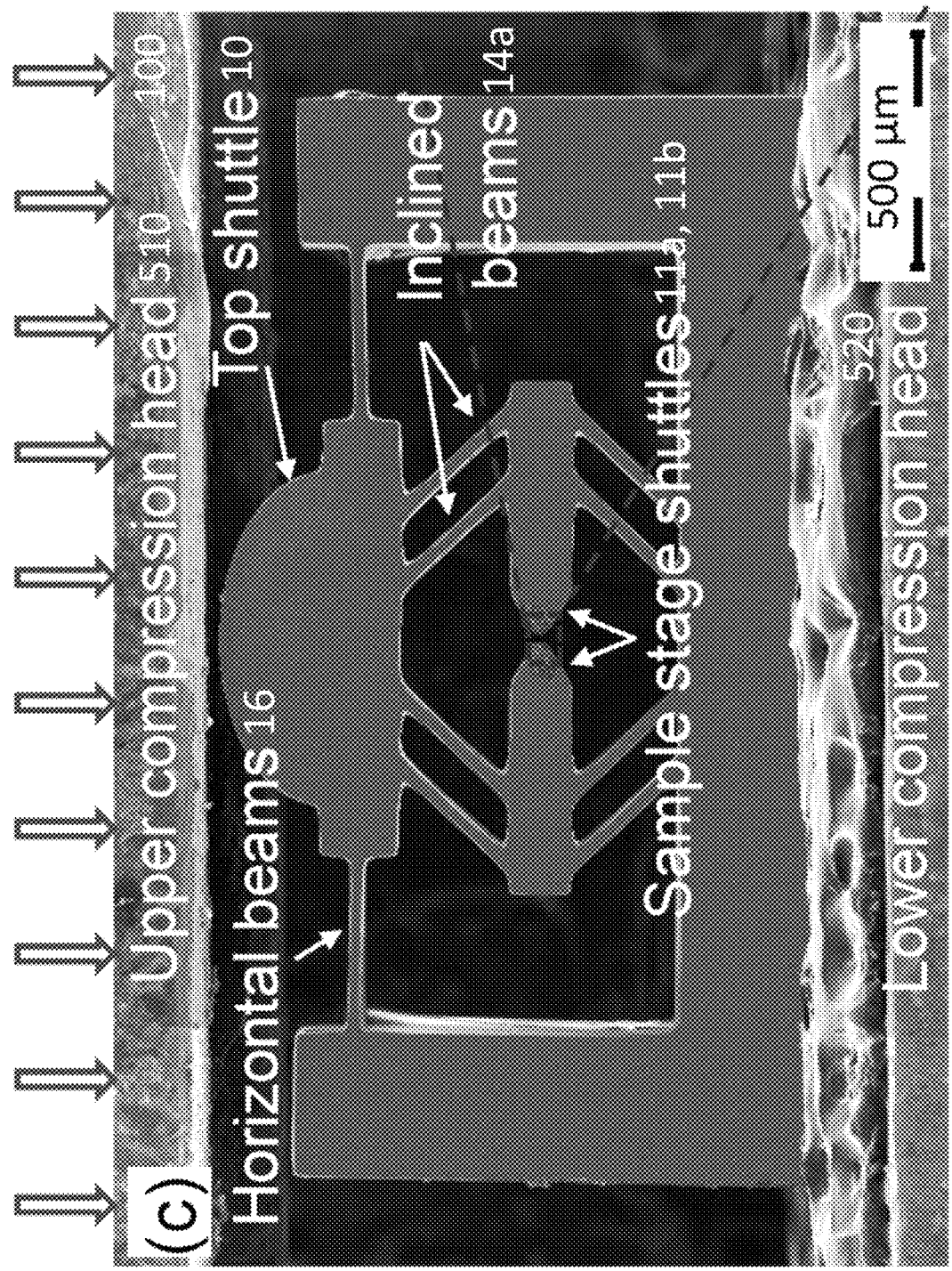
FIG. 3c shows a SEM image of a 3D printed PTP device from the front view.

Referring to FIGS. 3b to 3c, the core structure 102 of the PTP device 100 is printed by a first material e.g. polymer as a first plurality of layers. To take full advantage of the spatial flexibility of 3D printing, supporting structure that comprises only the side columns 17 and bottom 18 are printed as additional layers following the printed portion of the core structure 102. This increases the thickness of the PTP device 100 and in turn facilitates the manipulation and attachment of the PTP device 100 onto the micro-compression stage 500 as shown in FIG. 5a.

Referring to FIG. 3d for the layer-by-layer construction of the PTP device 100, the device 100 is printed by a plurality of layers. Due to the two-dimension shape of the device 100, the first seven layers 111-117 printed are of the same geometry to resemble the core structure 102. To gain a good adhesion on the sample stage 11, the first bottom layer 111 has a thickness of 30 μm and other six following layers 112-117 have a thickness of 5 μm.

Then, additional fourteen layers of support columns 17 and bottoms 18 were printed to form the supporting structure 104 for ease of manipulation and attachment. Among them, four layers 121-124 following the core structure 102 were printed with a layer thickness of 5 µm and other ten layers 131-140 with a layer thickness of 30 µm to speed up the manufacture process.

Preferably, all layers were photochemically solidified under an exposure intensity of 30 but the thinner ones use 6 s whereas the thicker ones need 15 s. After printing, the completed PTP device 100 is washed with ethanol to remove wet resin off.

Optionally, the printed device 100 may be solidified with ultraviolet rays. In one example embodiment, the device 100 which is used for testing the thicker SiC nanowire sample may be additionally placed in a UV oven where it may be further hardened for 5 mins.

Preferably, the alignment of the additional layers 121-124, 131-140 with the top shuttle 10 of device 100 is less demanding than the core structure, as the upper compression head 510 of the micro-compression stage 500 are naturally parallel to lower compression head (see FIGS. 3c and 5a) to ensure an applied force on the top of half-moon shape shuttle 10 along the vertical direction.

Figure 4:
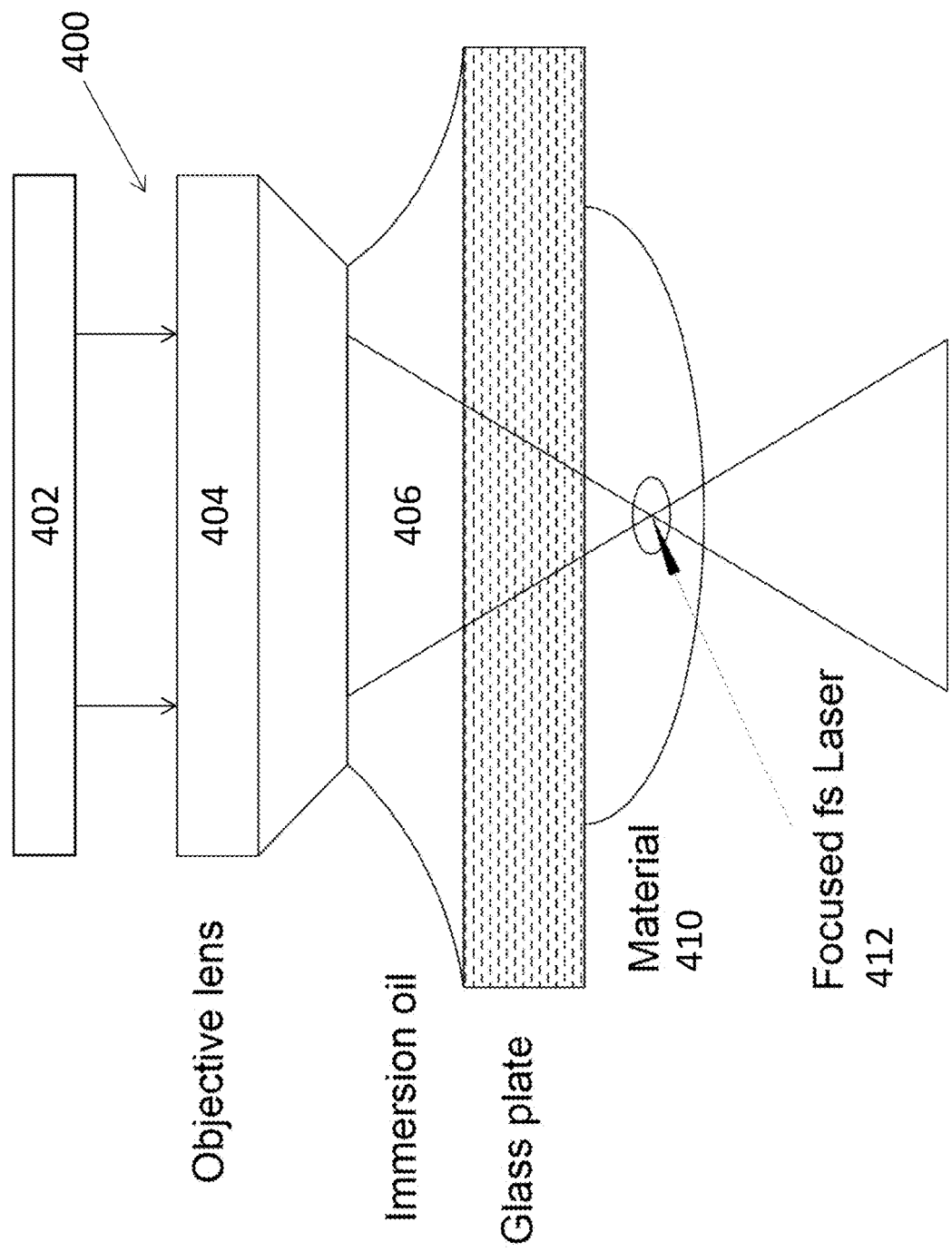
FIG. 4 is an illustration showing the working principle of stereolithography-based 3D printing system for fabrication of PTP device in accordance with one embodiment of the present invention.

In one alternative example, the PTP device 100 may be fabricated by Two Photon Lithography (TPL) as shown in FIG. 4. The TPL system 400 includes a laser beam emitting source 402, an objective lens 404 surrounded by immersion oil 406 for deflecting the laser beam. A photosensitive material 410 e.g. resin is mounted on a 2-D translational stage (in X-Y plane) and the laser beam emitting source 402 is mounted on Z-axis of a positioning system respectively. In use, the laser beam is focused into a predetermined spot 412 on the material 410 for polymerization and movable in three-dimensional, initially on a first X-Y plane for forming a first portion of the PTP device 100 and subsequently on a second X-Y plane for forming a second portion of the PTP device 100.

Preferably, the printed PTP device 100 is coated with a different material e.g. metal to improve the conductivity and stiffness of the device. For instance, coated plating e.g. thin conductive Ag may give a compact and stable thin film to the PTP device 100.

Figure 3E:
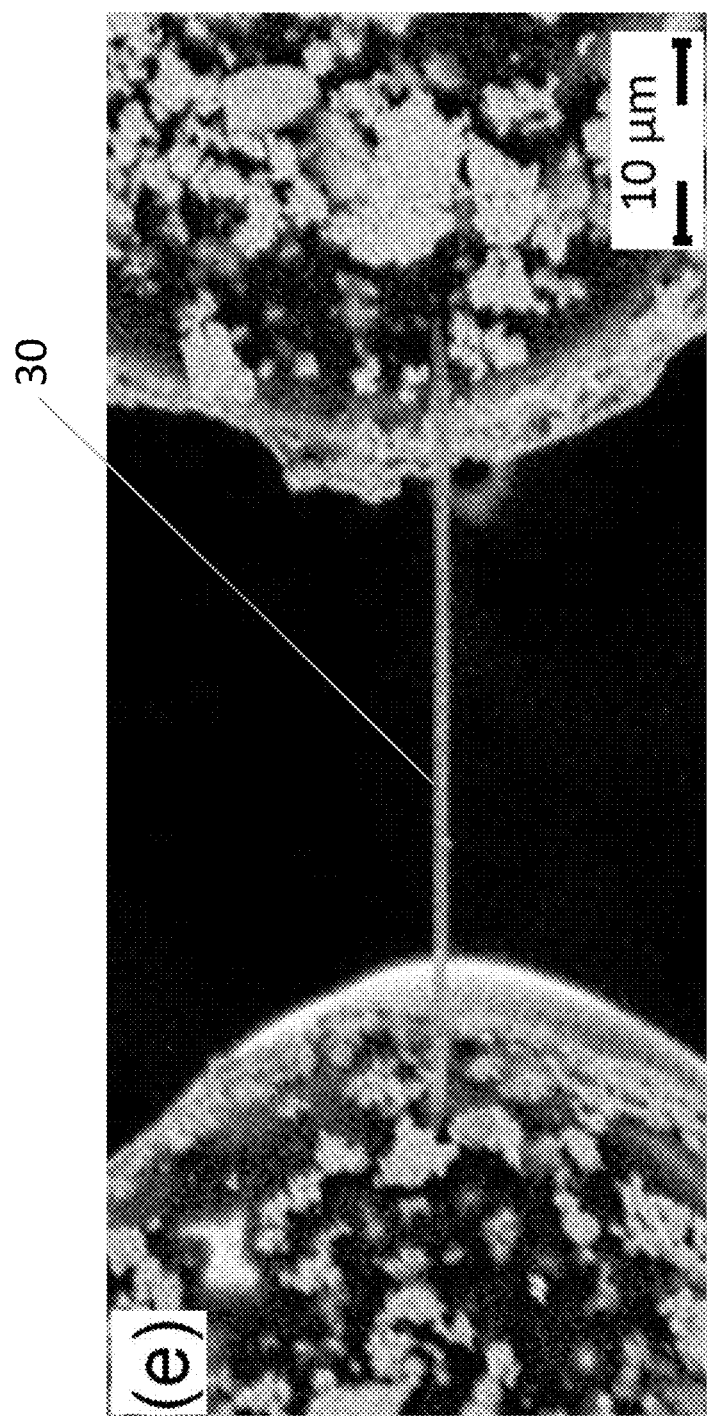
FIG. 3e shows a high magnification image of sample stage shuttles of the 3D printed PTP device in FIG. 3c, with a SiC nanowire sample attached.

In one example embodiment, there is provided a MMD 100 fabricated by the method in accordance with the present invention with SiC nanowires 30 loaded (as shown in FIGS. 3c and 3e). The tensile experiments of the clamped SiC nanowires 30 were performed inside a SEM equipped with a micro-compression stage.

In particular, the fabricated MMD 100 may be coated with metal e.g. a thin conductive Ag film by sputtering machine to improve the conductivity and becomes visible under SEM. Preferably, the thickness of the film is only around 20 nm so it can be ignored considering the mechanical performance of the devices 100.

With the aid of a micromanipulator, the SiC nanowire 30 is then positioned on the two sample-stage shuttles 11a, 11b under an optical microscope and fixed by conductive silver epoxy (as shown in FIG. 3e). After 24 h for the epoxy to solidify, the bottom pad 18 of the printed MMDs 100 is attached to the lower compression head 520 for testing using double coated carbon conductive taps (as shown in FIG. 3c).

The compression experiments of the MMD 100 is conducted with a displacement rate of 0.1 mm/min while the electron beam is focused on the nanowire sample 30 in order to monitor its deformation process during the in-situ tensile test. The loading continued for a while after failure happened to acquire the intrinsic stiffness of the device 100 without samples 30.

The inventors also devised the relationship between the strength of the sample loaded device 100 and the strength of the sample 30 by finite element method (FEM).

In principle, the clamped nanowire or microwire samples 30 may be simplified as a spring to mechanically interact with the MMD 100 and for different testing material samples 30 with comparable dimensions, the increase of sample stiffness would increase the stiffness of the sample loaded device 100. Hence, once the stiffness relationship is obtained from the finite element analysis (FEA), the stiffness of real sample (Ks) may be determined from measured stiffness of the sample loaded device 100 (Kd).

Further, the tensile modulus of the testing materials can be calculated by the gauge length (L) and cross section areas (A) of sample 30, which can be measured using real-time SEM imaging:

$$E = K_s L / A \qquad (1)$$

For a testing sample 30 of specific stiffness, the force conversion factor ($C_F$, i.e., the ratio of the force acting on sample 30 to that applied by compression head 510, 520 and the displacement conversion factor ($C_D$, i.e., the ratio of the distance change of sample stage 11a, 11b to the displacement of compression head 510, 520) remains constant until the fracture of the sample 30. The two conversion factors for the sample 30 of known stiffness may also be concluded using FEA, which can be used to derive experimental force-displacement curve of the sample 30 from that of the MMD 100. Thus, the sample load can be calculated using the known applied force and displacement data from the nanoindenter 12, after applying conversion factors calculated through finite element modelling.

The inventors have devised that the most desired devices 100 must possess the highest sensitivity to the sample stiffness and also maintain constant $C_F$ and $C_D$ until sample 30 fracture. To explore the optimal performance of the MMD 100, the configuration and geometrical characteristics of inclined beams 14a, 14b is determined.

Figure 5C:
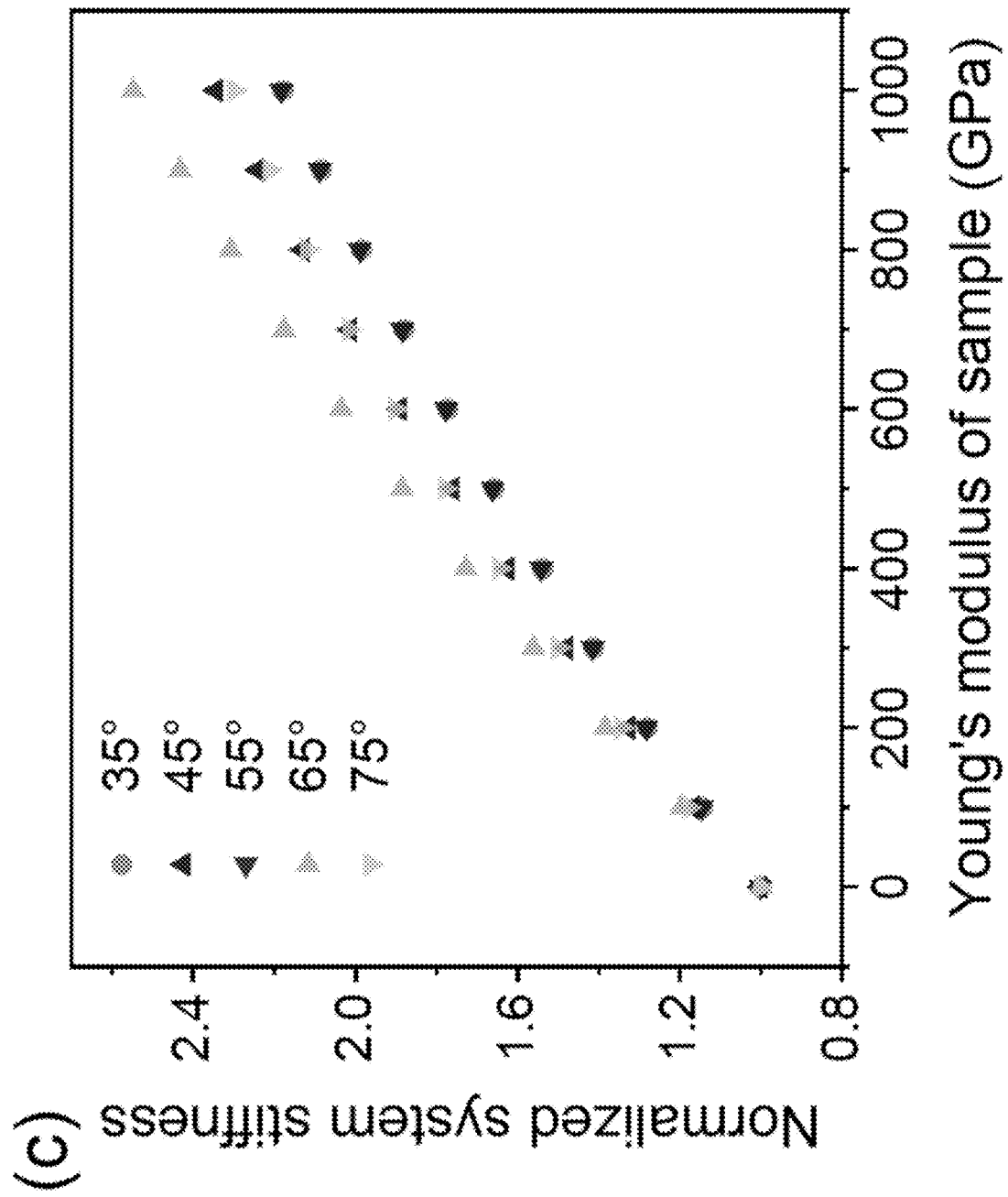
FIG. 5c shows the normalized stiffness of devices with different inclination angles as a function of Young's Modulus of the attached sample.

In one example embodiment, five MMD devices 100 with inclined beams 14a, 14b positioned at different inclination angles varying from 35° to 75°, with an increment of 5°, were investigated. To compare the sensitivity to the sample properties of different devices 100, the effect of the sample's Young's Modulus on the stiffness of the sample loaded devices 100 is obtained (as shown in FIG. 5c), and the latter was normalized by dividing the intrinsic stiffness of device 100. The stiffness of system increases as sample's Young's Modulus increases for all kinds of devices but the relationship between their sensitivities and inclination angles is not monotonic.

Among these five angles, the device of 65° inclination angle shows the highest sensitivity, followed by the 45° and 75° inclination angles, whereas the 35° and 55° inclination angles demonstrate the lowest sensitivity. Besides, $C_D$ of all devices 100 were investigated for the tensile testing of samples 30 with a Young's Modulus of 400 GPa.

Figure 5D:
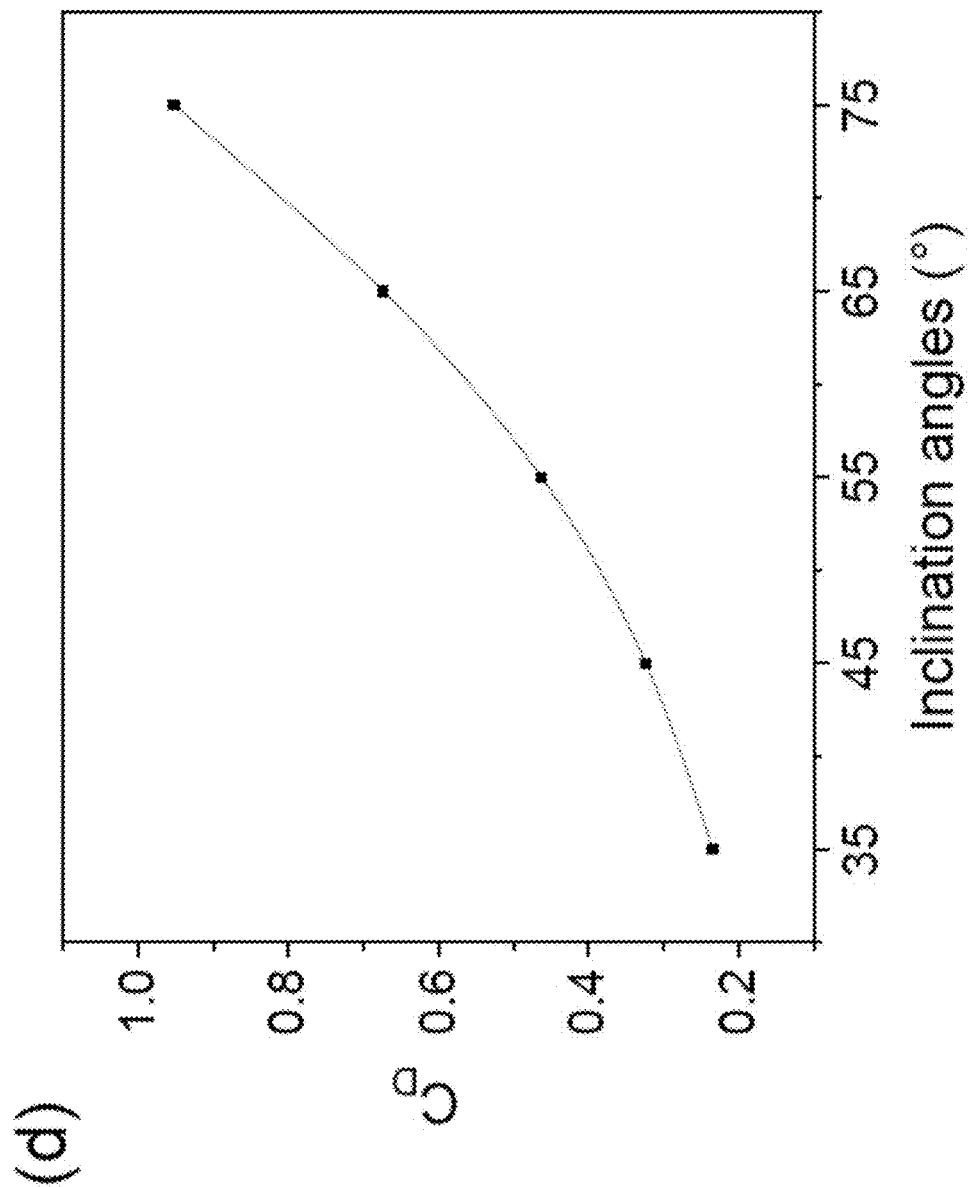
FIG. 5d shows the displacement conversion factor as a function of device inclination angles.
Figure 5E:
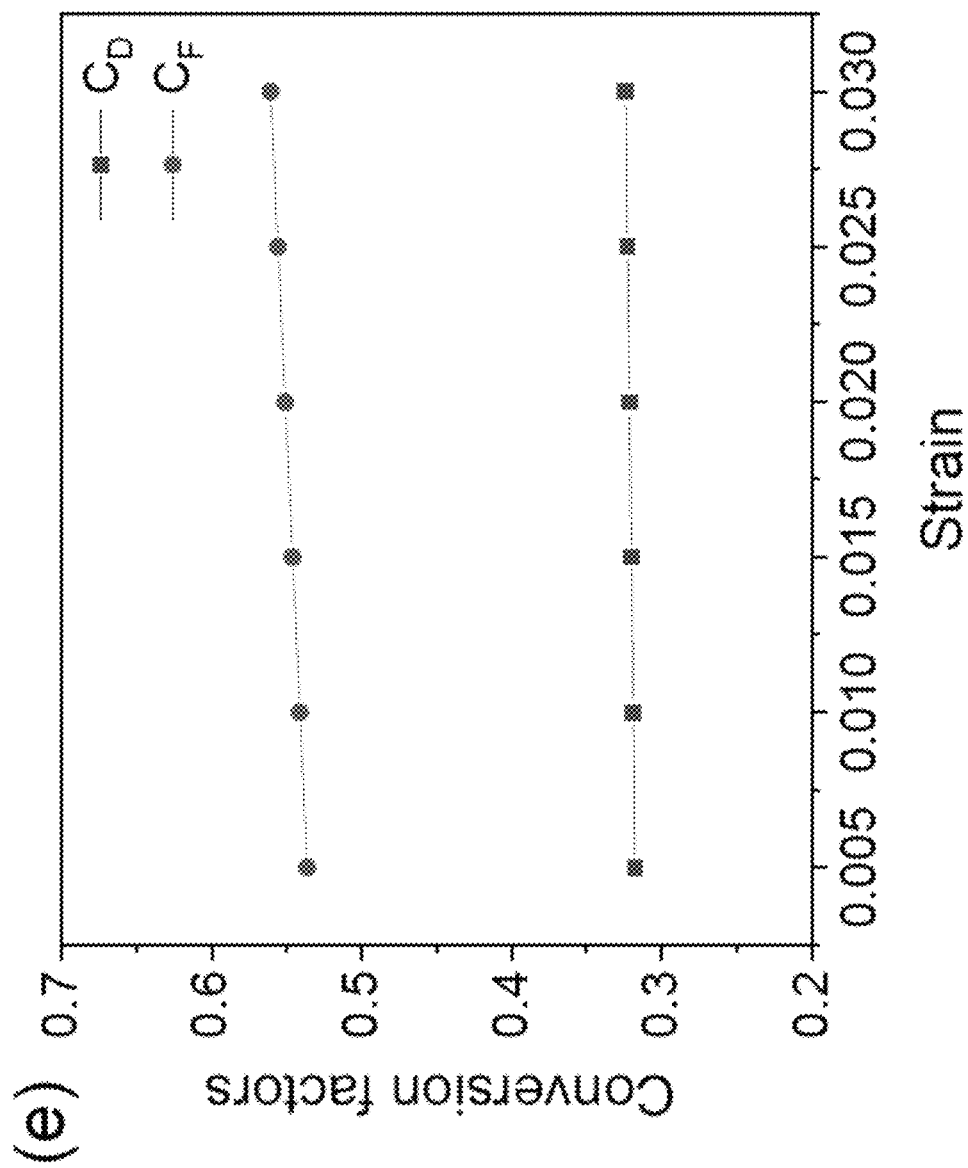
FIG. 5e shows the displacement and force conversion factors as a function of sample strain for the device with 45° inclination angle.

As shown in FIG. 5d, the bigger the inclination angles, the bigger $C_D$ of the device 100. Compared with the 65° inclination angle device, the 45° one can reduce $C_D$ by 52% without a large loss of the sensitivities to sample properties. Thus, device 100 with 45° inclination angle is more preferable to 65°. Both $C_D$ and $C_F$ of device 100 with 45° for measuring the given sample 30 keep almost constant before fracture happened at a maximum strain of 3% (as shown in FIG. 5e).

In one example embodiment, two SiC nanowire samples 32, 34 with dimensions shown in Table 1 were tested with two MMDs 100. The gauge lengths of two samples 32, 34 are very close, which is the distance between clamping points when the sample 32, 34 is stretched. The formation of the first and second MMDs 100 is substantially the same, except the second MMD 100 has been subjected to post curing process.

TABLE 1

The dimensions and measured results for two SiC nanowire samples

| | Dimensions (μm) | | System stiffness (N/mm) | | Conversion factors | | Young's Modulus (GPa) | Strain at failure (%) | Tensile strength (GPa) |
| | | | Before sample fracture | After sample fracture | | | | | |
| Sample | Diameter | Gauge length | | | $C_F$ | $C_D$ | | | |
| --- | --- | --- | --- | --- | --- | --- | --- | --- | --- |
| 1 | 0.33 | 36.9 | 0.90 | 0.69 | 0.41 | 0.39 | 253.8 | 2.0 | 5.9 |
| 2 | 0.71 | 43.9 | 1.83 | 0.98 | 0.61 | 0.27 | 297.0 | 1.8 | 3.1 |

Figure 6A:
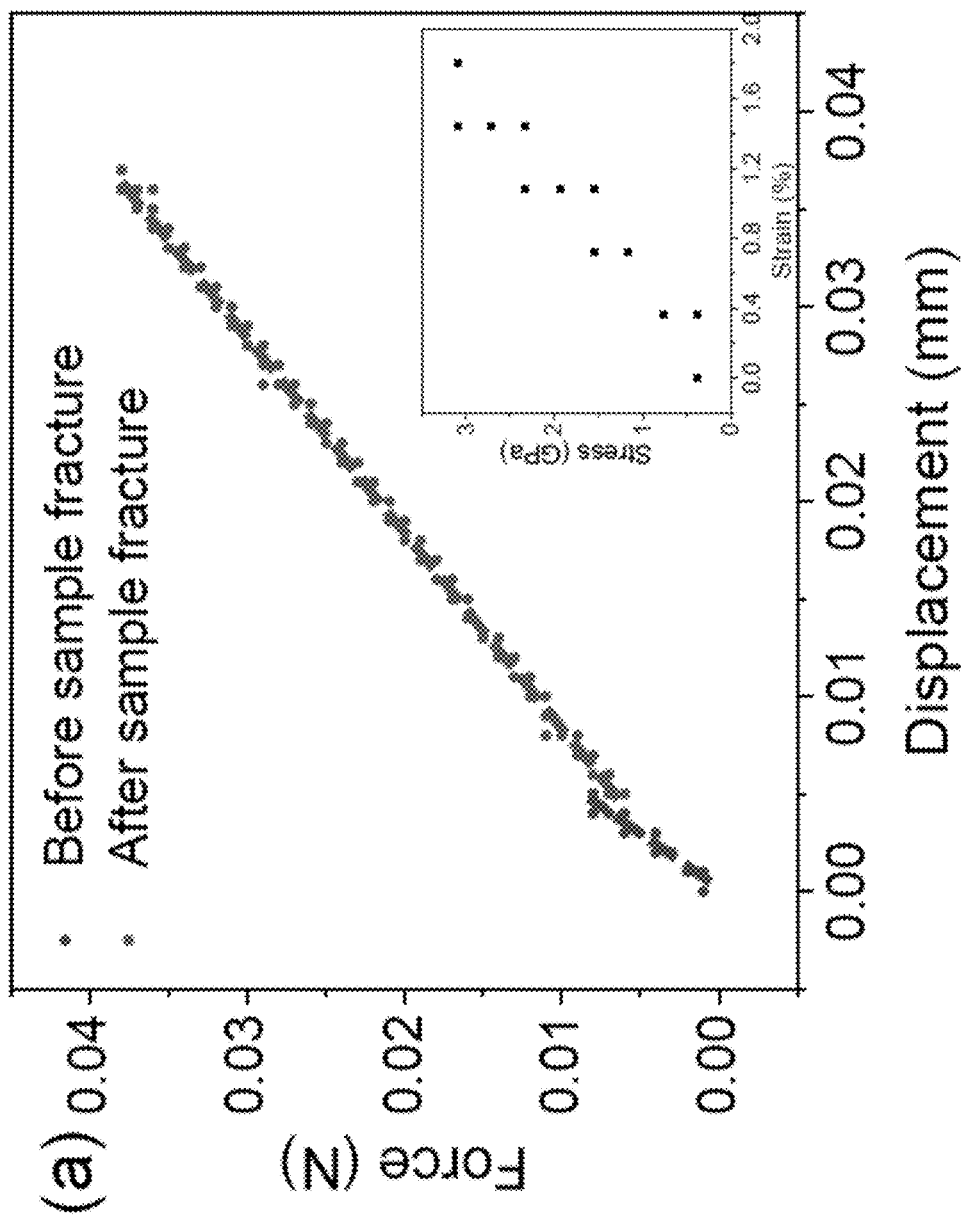
FIG. 6a shows the raw compression load versus displacement curve of the PTP device, with the inset showing the converted stress versus strain curve of the sample.

The load versus displacement curves of the devices 100 were recorded after SiC nanowire 32, 34 began to be stretched (as shown in FIG. 6a). A sudden change in the slope of curves occurs, indicating the failure of nanowire 32, 34. Therefore, the slope of the curves after the failure of sample 32, 34 equals to the intrinsic stiffness of the devices 100 and may be used to calibrate the finite element model of MMD 100 to eliminate the difference in geometries and materials properties between design and final product. After calibration, the stiffness of the sample 32, 34 is estimated by FEA according to the measured stiffness of sample loaded device 100 (i.e. the curve slope before the failure of sample) to further derive the Young's Modulus, $C_D$ and $C_F$.

Figure 6B:
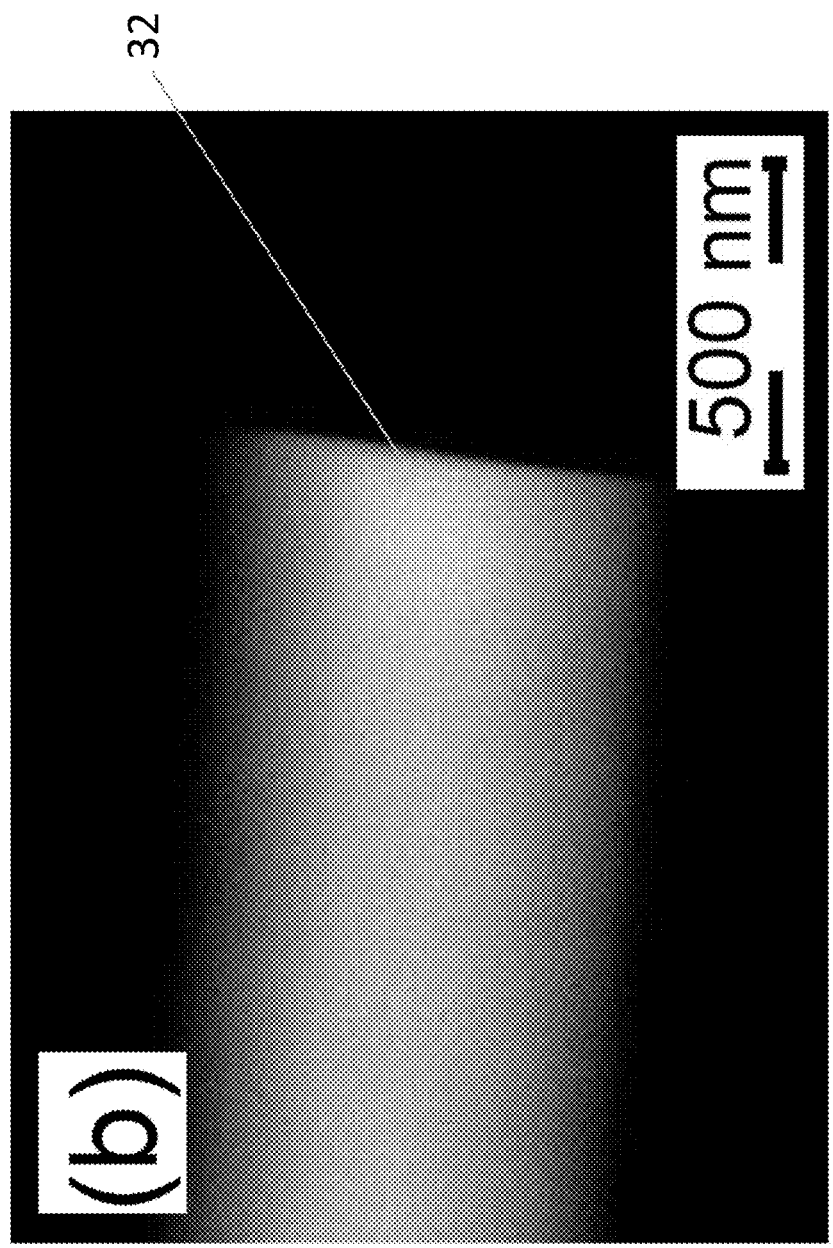
FIG. 6b shows the fracture surfaces of the SiC nanowire sample.
Figure 6C:
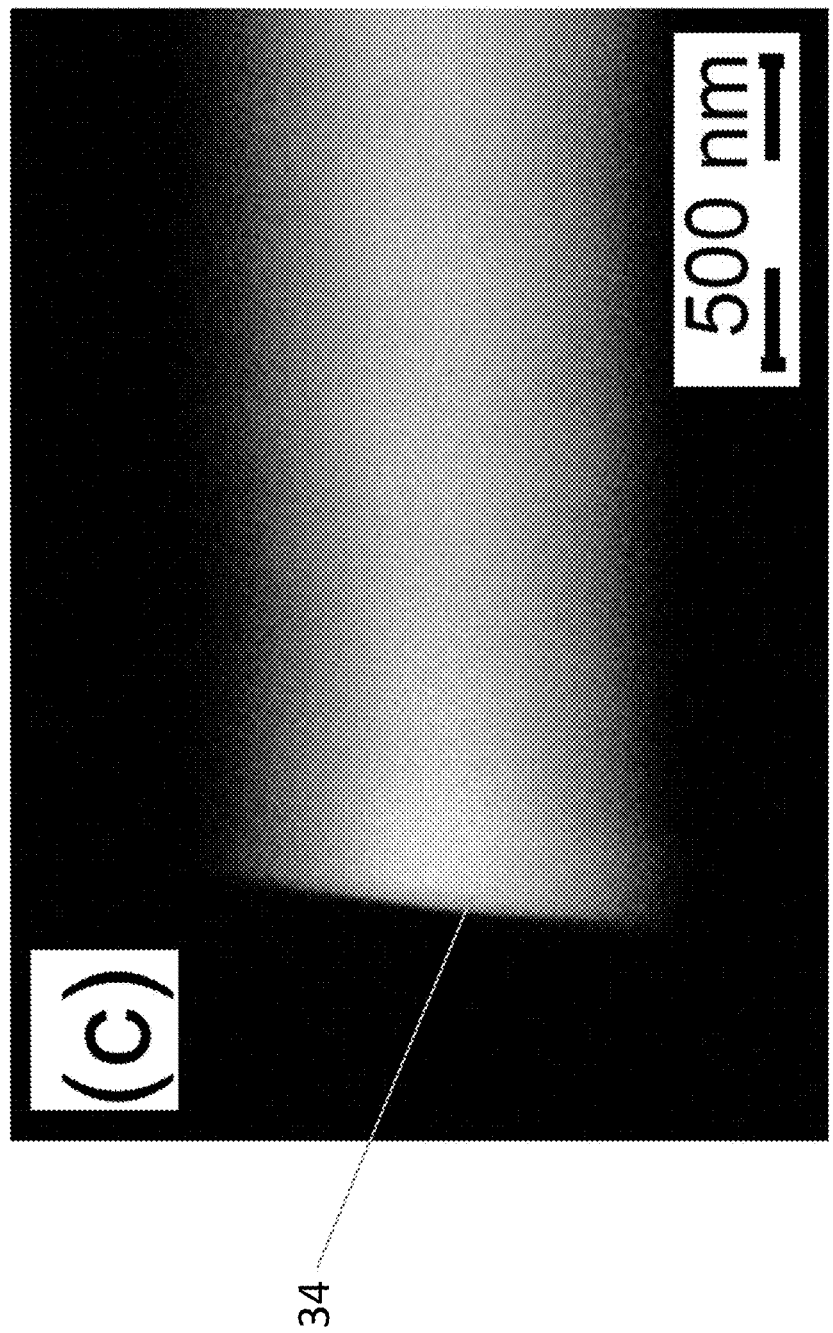
FIG. 6c shows the fracture surfaces of the SiC nanowire sample.
Figure 6D:
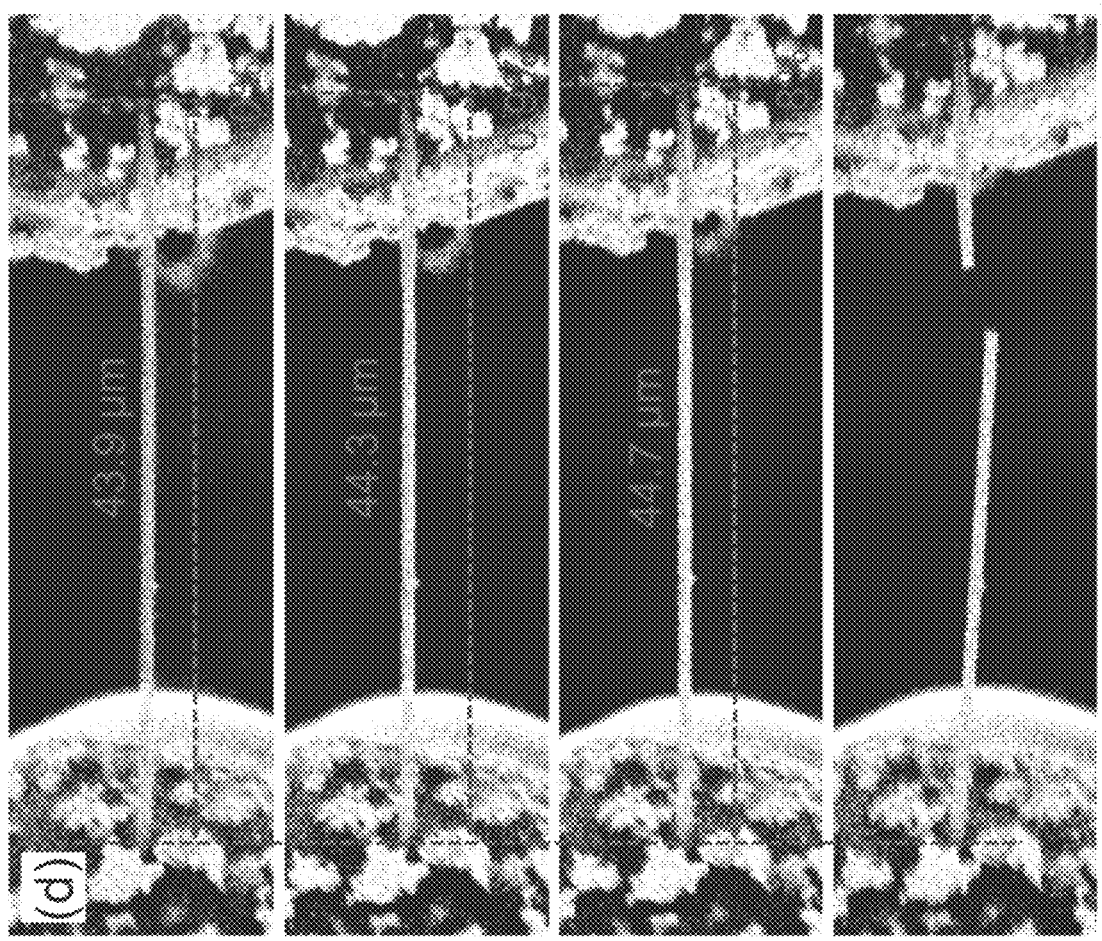
FIG. 6d shows sequential images recorded during the in-situ SEM tensile test of the SiC nanowire, with the pristine nanowire shown on top, and followed by two images at strain of 0.9% and 1.8%, and the fractured morphology shown at the bottom.

The sample strain at break was measured directly from SEM images. The maximum force of the sample 32, 34 may be calculated by multiplying the maximum load applied on the device 100 before the samples 32, 34 fractures by $C_F$ to obtain the tensile strength. As shown in Table 1, the measured values of Young's Modulus of both SiC nanowire samples 32, 34 are lower than the reference values of 400 GPa from the manufacturer, which can be attributed to the uneven diameter of nanowire samples 30 and the existence of other defects. Besides, the measured results of the failure strain and tensile strength are in good agreement with the reference value of 2% and 5 GPa to 7 GPa, respectively. The fracture surfaces of both samples 32, 34 (as shown in FIGS. 6b and 6c) are perpendicular to the loading direction, which is typical of brittle fracture.

Advantageously, the devices 100 still maintain a linear elastic behavior for a long time after the failure of sample 32, 34, which demonstrates their ability for testing nanowires with much larger elongation. Compared with the first device 100, the intrinsic stiffness of the second device 100 increases 54% due to the post curing process.

Advantageously, the whole manufacturing operation only took around 40 mins (including the post curing process) and cost a tiny fraction of photosensitive polymer, demonstrating its low-cost and high efficiency than those silicon microfabrication processes.

Advantageously, the size of the MMD device can be changed readily due to the wide range of printing scale of the 3D printing equipment. The MMD device's size can be modified easily based on the user requirement. The production speed is also very considerable.

Advantageously, the MMD fabricated by the nanoscale additive manufacturing (Micro Lithographic Stereo Exposure) of the present invention may be much facile to control the complex and arbitrary shape of the device. The photopolymer material used is also cheaper than silicon materials. Furthermore, the formed MMD device does not need any cleaning with using any harmful solutions e.g. hazard chemical solutions. This technology will reduce experiment cost greatly.

In addition, the MMD construed by the present invention can be operated in ambient laboratory environment for environmental-controlled in-situ mechanical experiments under an optical microscope, as demonstrated by in-situ tensile test of testing materials with dimensions increasing to microscale level.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method of constructing a micromechanical device for characterizing strength of a low dimensional material sample, the method comprising the steps of:
    a) generating a three-dimensional representation of the micromechanical device wherein the micromechanical device is adapted to accommodate different samples;
    b) transforming the three-dimensional representation into a plurality of two-dimensional slices wherein each said slice individually represents a portion of the three-dimensional representation; and
    c) forming the micromechanical device through additive manufacturing based on the plurality of two-dimensional slices; the micromechanical device formed from a fluid medium arranged to transform its physical state in response to a manipulated illumination exposed thereto.

2. The method according to claim 1, wherein step a) further includes step a1) of:
    meshing the three-dimensional representation to obtain a plurality of meshes each representing a portion of the three-dimensional representation; and
    analysing strength of one or more portions of the three-dimensional representation based on the generated meshes.

3. The method according to claim 1, wherein step c) further includes step c1) of printing a portion of the micromechanical device from a first material with reference to a said two-dimensional slice.

4. The method according to claim 3, wherein step c) further includes step c2) of printing another portion of the micromechanical device from the first material with reference to another said two-dimensional slice, with one formed portion of the micromechanical device stacked on the other formed portion of the micromechanical device.

5. The method according to claim 4, wherein the two portions of the micromechanical device have a uniform thickness.

6. The method according to claim 4, wherein the thickness of a portion of the micromechanical device is different from that of another portion of the micromechanical device.

7. The method according to claim 1, further including step d) of solidifying the formed micromechanical device by exposing it to an illumination.

8. The method according to claim 7, wherein the illumination includes ultraviolet rays.

9. The method according to claim 1, further including step e) of depositing a layer made of a second material onto the formed micromechanical device made of a first material for reinforcing the strength of the micromechanical device.

10. The method according to claim 9, wherein the conductivity and toughness of the second material is higher than that of the first material.

11. The method according to claim 9, wherein the first material includes polymer.

12. The method according to claim 9, wherein the second material includes metal.

13. The method according to claim 1, wherein step a) further includes step a2) of generating a one-dimensional representation arranged to represent a gap between a pair of shuttles on the micromechanical device formed by step c) with reference to a dimension of the said sample.

14. The method according to claim 13, wherein the gap between the shuttles is at least 2 µm wide.

15. The method according to claim 1, wherein the micromechanical device is a push to pull device (PTP) comprising a top shuttle onto which a compression force is exerted and a pair of shuttles through which the compression force exerted onto the top shuttle is converted to tensile force.

16. A micromechanical device for characterizing strength of a low dimensional material sample, the micromechanical device comprising:
   a) a first shuttle platform adapted to receive a compression force;
   b) a bottom;
   c) a first shuttle connected to the first shuttle platform and the bottom; and
   d) a second shuttle connected to the first shuttle platform and the bottom; the first shuttle and the second shuttle defining therebetween a gap adapted to accommodate a low dimensional material sample;
   wherein the first shuttle and the second shuttle are adapted to move relative to each other, thus resulting in a tensile force to the low dimensional material sample, when the first shuttle platform is applied with the compression force.

17. The micromechanical device according to claim 16, wherein the first shuttle and the second shuttle each have an elongated shape; the first shuttle and the second shuttle located on and adapted to move substantially along a virtual line; the micromechanical device further comprising:
   e) a first inclined beam movably connecting the first shuttle to the first shuttle platform;
   f) a second inclined beam movably connecting the second shuttle to the first shuttle platform;
   wherein the first and second inclined beams are adapted to convert the compression force into motions of the first and second shuttles to create the tensile force.

18. The micromechanical device according to claim 17, further comprises a plurality of said first inclined beams which are substantially parallel to each other, and a plurality of said second inclined beams which are substantially parallel to each other.

19. The micromechanical device according to claim 17, further comprises
   g) a third inclined beam movably connecting the first shuttle to the bottom; and
   h) a fourth inclined beam movably connecting the second shuttle to the bottom.

20. A method of characterizing strength of a low dimensional material sample using a micromechanical device according to claim 16, comprising the steps of:
   a) positioning the low dimensional material sample in the gap between the first shuttle and the second shuttle of the micromechanical device;
   b) applying the compression force to the first shuttle platform to apply the tensile force to the low dimensional material sample; and
   c) characterizing strength of the low dimensional material sample with reference to a strength of the micromechanical device.

* * * * *